United States Patent
Yee et al.

(10) Patent No.: US 8,018,039 B2
(45) Date of Patent: Sep. 13, 2011

(54) INTEGRATED CIRCUIT PACKAGE SYSTEM WITH STACKED DEVICES

(75) Inventors: Jae Hak Yee, Shanghai (CN); Frederick Cruz Santos, Shanghai (CN); Yong Yong Xia, Shanghai (CN); Jun Jie Xu, Shanghai (CN)

(73) Assignee: Stats Chippac Ltd., Singapore (SG)

( * ) Notice: Subject to any disclaimer, the term of this patent is extended or adjusted under 35 U.S.C. 154(b) by 543 days.

(21) Appl. No.: 12/043,789

(22) Filed: Mar. 6, 2008

(65) Prior Publication Data

US 2009/0224389 A1   Sep. 10, 2009

(51) Int. Cl.
*H01L 23/02* (2006.01)
(52) U.S. Cl. .. 257/686; 257/700; 257/778; 257/E23.085
(58) Field of Classification Search .................. 257/686, 257/700, 778, E23.085
See application file for complete search history.

(56) References Cited

U.S. PATENT DOCUMENTS

| | | | |
|---|---|---|---|
| 7,170,160 B1 | 1/2007 | Wang | |
| 7,265,442 B2 | 9/2007 | Henttonen | |
| 7,282,791 B2 | 10/2007 | Funaba et al. | |
| 7,288,835 B2 | 10/2007 | Yim et al. | |
| 2004/0195667 A1* | 10/2004 | Karnezos | 257/686 |
| 2006/0284299 A1* | 12/2006 | Karnezos | 257/686 |
| 2007/0278643 A1 | 12/2007 | Yee | |

* cited by examiner

*Primary Examiner* — Marcos D. Pizarro
*Assistant Examiner* — Eva Yan Montalvo
(74) *Attorney, Agent, or Firm* — Mikio Ishimaru (57) ABSTRACT

An integrated circuit package system comprising: providing an integrated circuit die having an active side; forming a first internal stacked module and a second internal stacked module over the active side of the integrated circuit die; and coupling an electrical interconnect between the first internal stacked module or the second internal stacked module and the active side.

20 Claims, 6 Drawing Sheets

INTEGRATED CIRCUIT PACKAGE SYSTEM WITH STACKED DEVICES

TECHNICAL FIELD

The present invention relates generally to integrated circuit packaging, and more particularly to a system for manufacturing increased density integrated circuit packages.

BACKGROUND ART

The advent of personal video players, personal data assistants, smart telephones, global positioning systems, and the like has put an extreme amount of pressure on packaging manufacturers. The increased function and reduced size of these personal devices requires innovative approaches to package more function in a smaller space. There is also a requirement to reduce the interconnect complexity of the printed circuit board associated with these devices.

The changes in memory packaging are a key example in the evolution of integrated circuit packaging. As memory requirements increase so does the number of integrated circuits stacked in a package. System in Package (SIP) designs may include many different integrated circuits in a single package. These designs typically use stacking techniques that may layer several different integrated circuits in a single package. While these techniques do increase integrated circuit density in the package, they can also be devastating to yields in the manufacturing process. A single faulty integrated circuit or loose interconnect can cause the whole package to be non-functional.

The economic pressures that come along with the booming consumer electronics phenomenon will not allow the use of a component that is not available in high volume or carries too high of a price tag. Most multiple integrated circuit packaging systems have a predictable failure rate associated with their manufacturing process. In order to enhance the yields of the manufacturing flow, testing may be performed at multiple levels of the assembly process in order to weed out failures as early as possible. Each testing event increases the cost of a finished device. A balance must be struck between testing an intermediate level product and having an acceptable end of the line manufacturing yield.

Many techniques and packaging technologies have attempted to solve the balance, but as the increase in embedded function continues other approaches must be found. This issue impacts the capacity and reliability of memory packages, system in chip packages, and advanced micro processor designs.

Thus, a need still remains for an integrated circuit package system with stacked devices. In view of the rate of development of consumer electronics and the insatiable demand for memory devices at low manufacturing costs, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing an integrated circuit die having an active side; forming a first internal stacked module and a second internal stacked module over the active side of the integrated circuit die; and coupling an electrical interconnect between the first internal stacked module or the second internal stacked module and the active side.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Figure 1:
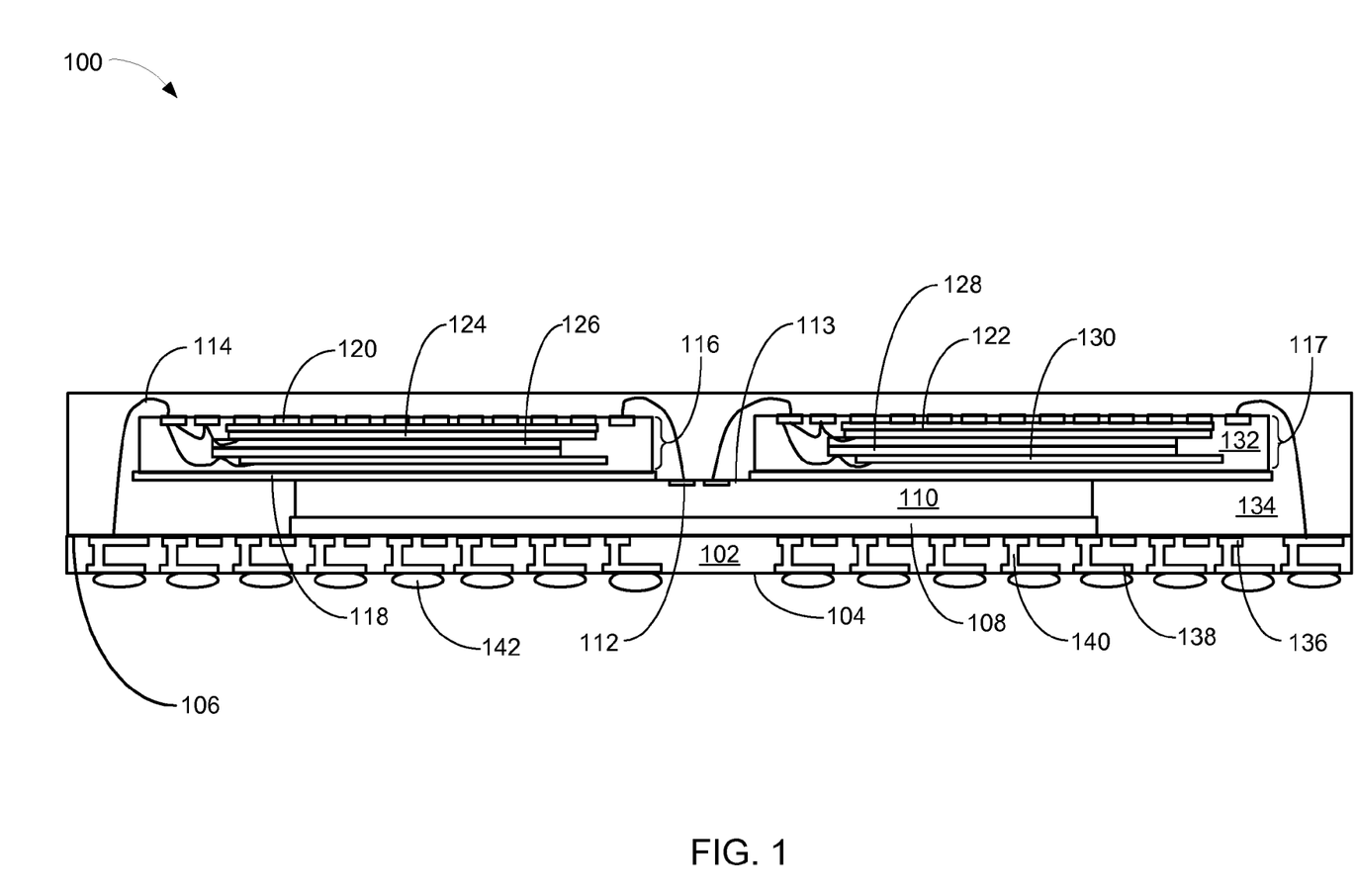
FIG. 1 is a cross-sectional view of an integrated circuit package system with stacked devices, in an embodiment of the present invention.

Referring now to FIG. 1, therein is shown a cross-sectional view of an integrated circuit package system 100 with stacked devices, in an embodiment of the present invention. The cross-sectional view of the integrated circuit package system 100 depicts a substrate 102 having a system side 104 and a component side 106. A first adhesive 108, such as a die attach material, may be attached on the component side 106 of the substrate 102. An integrated circuit die 110, such as a memory die, application specific integrated circuit, or analog integrated circuit, may be mounted on the first adhesive 108. The integrated circuit die 110 may have center contacts 112, positioned on an active side 113, for electrical connection to the next level of system.

An electrical interconnect 114, such as bond wire, may electrically connect the center contacts 112 to a first internal stacked module (ISM) 116 and a second internal stacked module 117. The first internal stacked module 116 and the second internal stacked module 117 are substantially similar and the description that applies to the first internal stacked module 116 may also apply to the second internal stacked module 117. The first internal stacked module 116 and the second internal stacked module 117 may be attached over the active side 113 of the integrated circuit die 110 by a second adhesive 118, which may be substantially similar to the first adhesive 108.

The ISM 116 may have a module platform 120, such as a substrate or a lead frame, with a third adhesive 122 mounted thereon. A first stacked integrated circuit 124 may be mounted on the third adhesive 122, which may be substantially similar to the first adhesive 108 and the second adhesive 118. The electrical interconnect 114 may electrically connect the first stacked integrated circuit 124 to the module platform 120.

A wire-in-film (WIF) adhesive 126 may be applied on the first stacked integrated circuit 124 and the electrical interconnect 114. The wire-in-film adhesive 126 may be used to attach a second stacked integrated circuit 128. In the manufacturing process of the ISM 116, the wire-in-film adhesive 126 and the second stacked integrated circuit 128 are mounted over the first stacked integrated circuit 124. A third stacked integrated circuit 130 may be mounted over the second stacked integrated circuit 128. The electrical interconnect 114 may couple the first stacked integrated circuit 124, the second stacked integrated circuit 128, the third stacked integrated circuit 130, the module platform 120, or a combination thereof.

A module body 132, such as an epoxy molding compound, may be formed on the first stacked integrated circuit 124, the second stacked integrated circuit 128, the third stacked integrated circuit 130, and the module platform 120. The current figure is an example only and no limitation is implied. The ISM 116 may have a different number of the stacked integrated circuits. The ISM 116 is shown as mounted over the integrated circuit die 110 in an inverted position and coupled by the electrical interconnect 114, but other configurations are possible.

An outer package body 134, such as an epoxy molding compound, may be formed on the component side 106 of the substrate 102, the integrated circuit die 110, the electrical interconnects 114, and the ISM 116. The ISM 116 may provide a conductive path for the center contacts 112 to be electrically coupled to a contact pad 136 on the component side 106 of the substrate 102. A system contact 138 may be coupled to the contact pad 136 by a conductive via 140. A system contact 142, such as a solder ball, a solder bump, a solder column, stud bump, or other interconnect technology, may be used to attach the next level of system (not shown).

Figure 2:
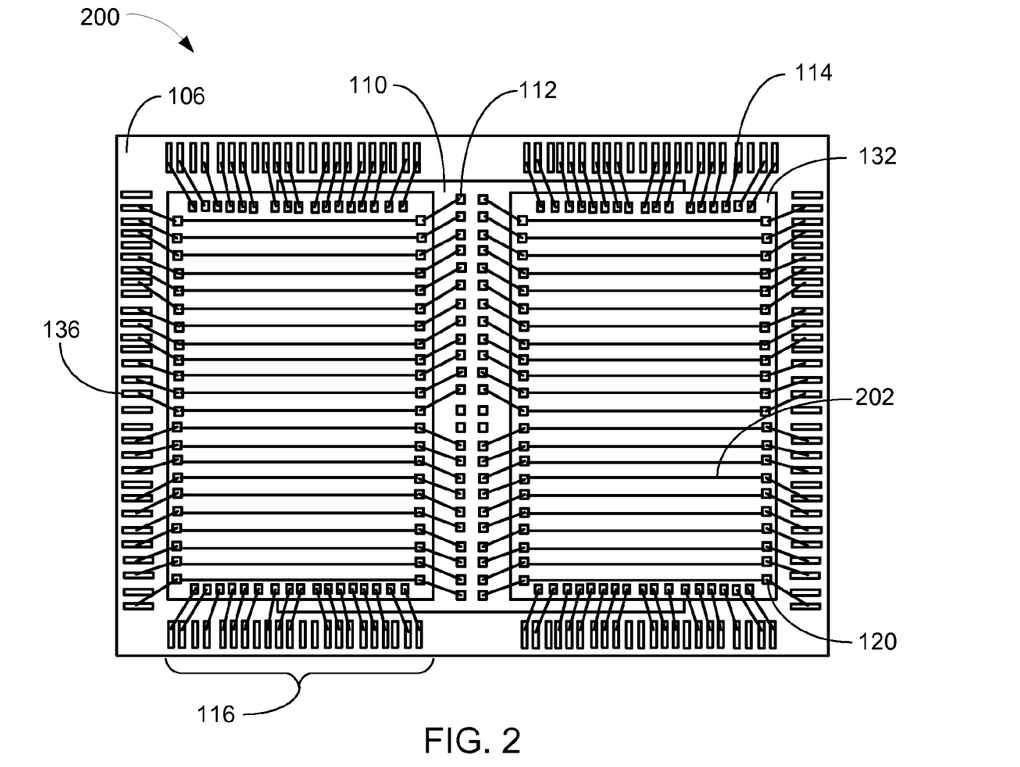
FIG. 2 is a top assembly view of an integrated circuit package system with stacked devices, in a wire bond phase of manufacturing.

Referring now to FIG. 2, therein is shown a top assembly view of an integrated circuit package system 200 with stacked devices, in a wire bond phase of manufacturing. The top assembly view of the integrated circuit package system 200 depicts the integrated circuit die 110, the second ISM 117, and the first ISM 116 mounted over the component side 106. The module body 132 may provide a lead on chip 202 for connecting the center contacts 112 to the contact pad 136 by the electrical interconnects 114. The module platform 120 may provide a contact point for forming an electrical connection between the ISM 116 and the contact pad 136 by the electrical interconnect 114.

This figure is by way of an example only and the number and position of the ISM 116 may differ. The number and position of the center contacts 112 and the contact pads 136 may also differ. The lead on chip 202 is shown in a simple routing example and may differ in the actual implementation. Some of the center contacts 112 are shown as not connected and this may differ in the actual implementation. The ISM 116 may be fully tested prior to being mounted over the integrated circuit die 110. This will allow a higher end of the line yield for the finished version of the integrated circuit package system 100, of FIG. 1.

Figure 3:
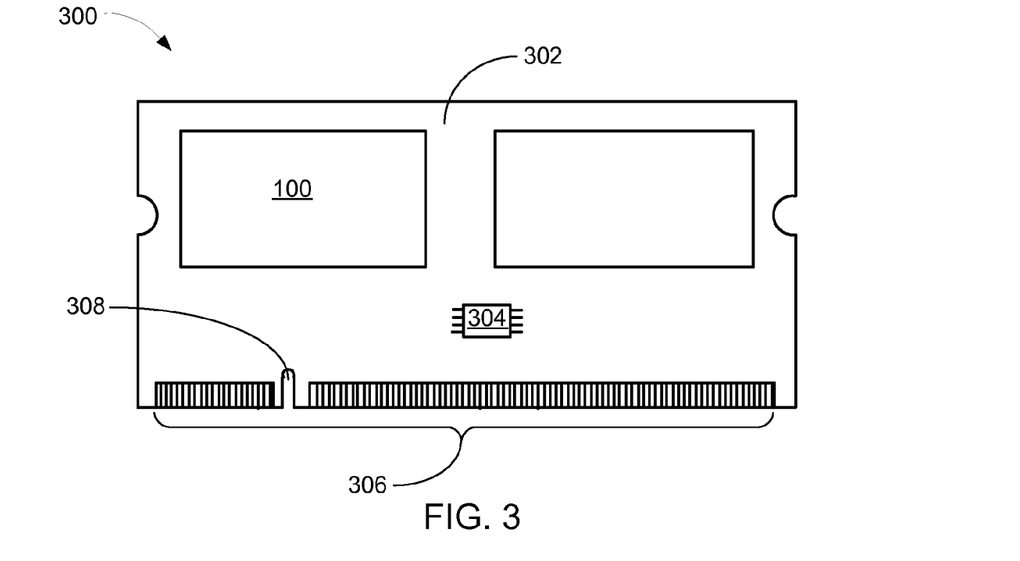
FIG. 3 is an assembly drawing of an application device using the integrated circuit package system.

Referring now to FIG. 3, therein is shown an assembly drawing of an application device 300 using the integrated circuit package system 100. The assembly drawing of the application device 300 depicts a circuit board 302, such as a dual in-line memory module (DIMM), having the integrated circuit package system 100 mounted thereon. A chip 304, such as an interface termination chip, may be mounted adjacent to the integrated circuit package system 100. The circuit board 302 may have a connector 306, such as an edge connector, with a guide key 308. The application device 300 may be a memory board, a multi-processor card, an analog processing function, or a combination thereof. These are examples of the type of application that might use the integrated circuit package system 100, but others may be possible.

Figure 4:
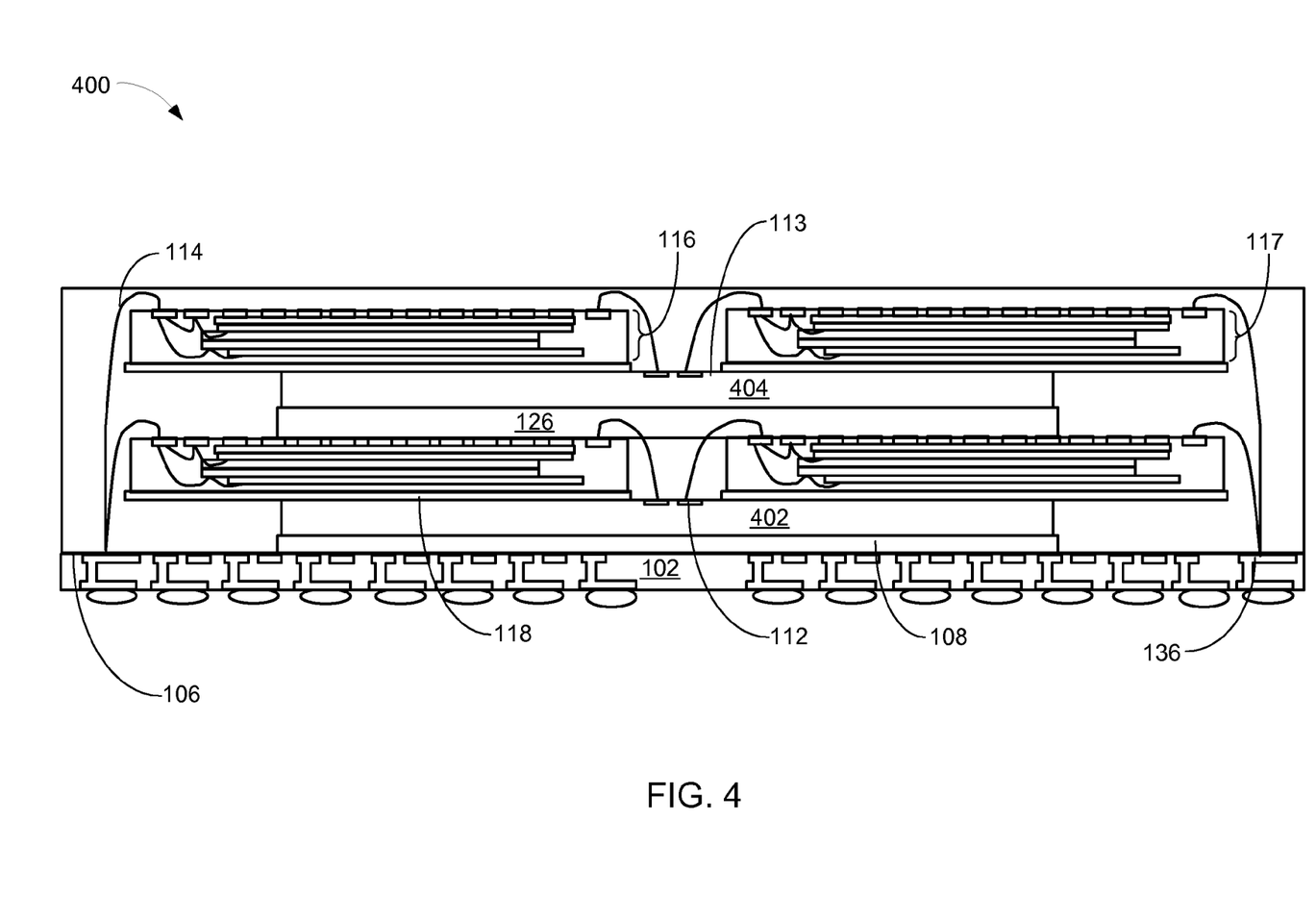
FIG. 4 is a cross-sectional view of an integrated circuit package system in a first alternative embodiment of the present invention.

Referring now to FIG. 4, therein is shown a cross-sectional view of an integrated circuit package system 400 in a first alternative embodiment of the present invention. The cross-sectional view of the integrated circuit package system 400 depicts the substrate 102 having the first adhesive 108 mounted on the component side 106. A first integrated circuit die 402 may be attached to the first adhesive 108. The first ISM 116 and the second ISM 117 may be attached to the active side 113 first integrated circuit die 402 by the second adhesive 118. The electrical interconnect 114 may electrically connect the center contacts 112 of the first integrated circuit die 402 to the ISM 116 and further couple the ISM 116 to the contact pad 136.

The wire-in-film adhesive 126 may be positioned on the ISM 116 and the electrical interconnect 114 to form a platform for attaching a second integrated circuit die 404. An additional unit of the ISM 116 may be mounted over the second integrated circuit die 404 by the second adhesive 118.

Further, the electrical interconnect 114 may couple the second integrated circuit die 404 through the ISM 116 to the contact pad 136. The outer package body 134, such as an epoxy molding compound, may be formed on the component side 106 of the substrate 102, the first integrated circuit die 402, the second integrated circuit die 404, the electrical interconnects 114, and the ISM 116.

This configuration while adding an amount of vertical height has doubled the integrated circuit capacity as compared to FIG. 1. This example allows a scaling of capability in the integrated circuit package system 100 with no change in the package foot print. In the example of a memory module formed by using the integrated circuit package system 100, may double the memory capacity without adding additional space on the circuit board 302, of FIG. 3, represents an aspect of the present invention.

Figure 5:
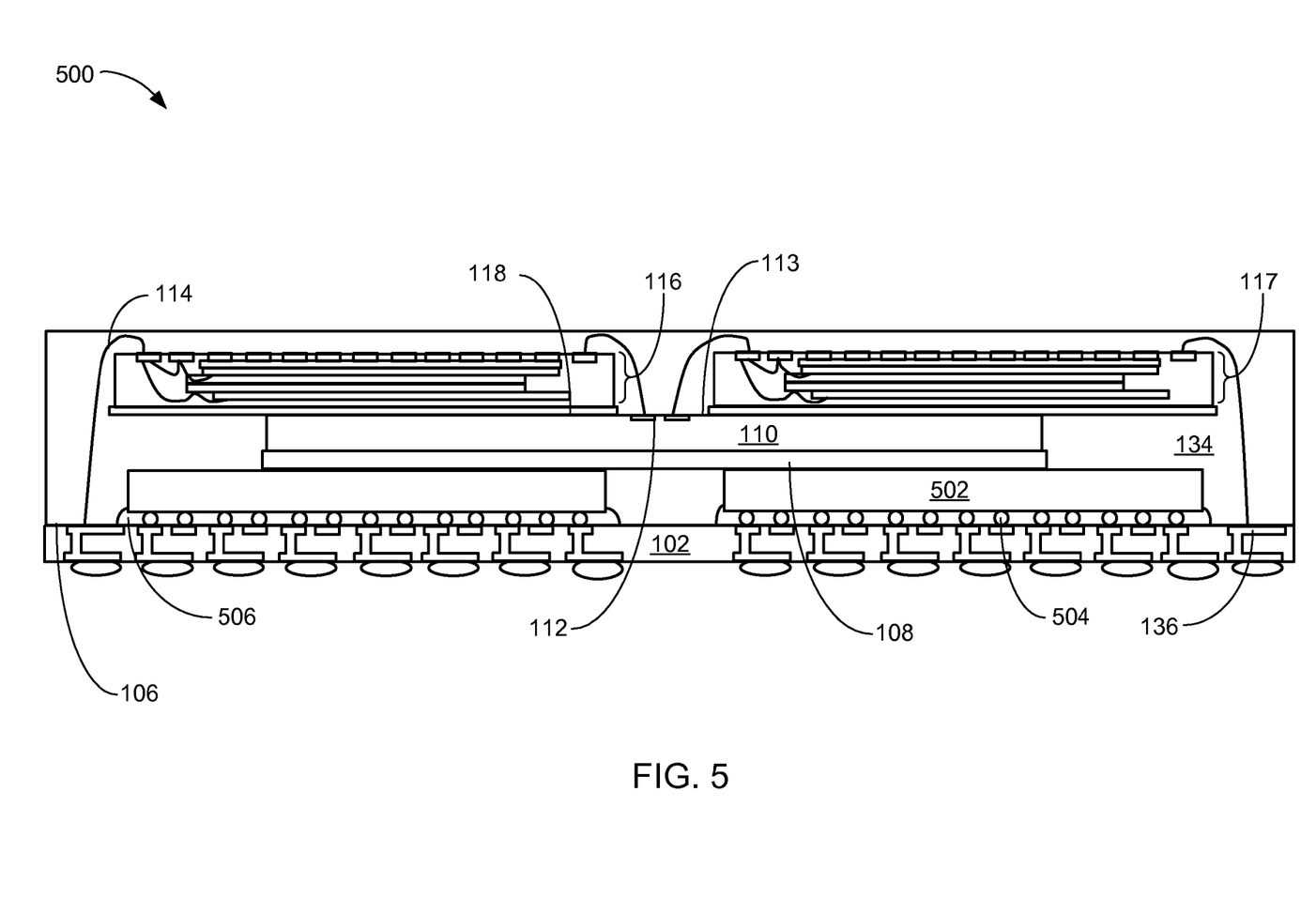
FIG. 5 is a cross-sectional view of an integrated circuit package system in a second alternative embodiment of the present invention.

Referring now to FIG. 5, therein is shown a cross-sectional view of an integrated circuit package system 500 in a second alternative embodiment of the present invention. The cross-sectional view of the integrated circuit package system 500 depicts the substrate 102 having a flip chip integrated circuit 502 coupled to the contact pad 136 by a chip interconnect 504, such as a solder ball, a solder bump, a solder column, a stud bump, or the like. An under fill 506 may optionally be applied between the component side 106 and the flip chip integrated circuit 502.

The first adhesive 108 may be applied on the flip chip integrated circuit 502. The integrated circuit die 110 may be attached to the first adhesive 108. The first ISM 116 and the second ISM 117 may be directly attached to the active side 113 of the integrated circuit die 110 by the second adhesive 118. The first internal stacked module 116 is coplanar to the second internal stacked module 117: The electrical interconnect 114 may couple the center contacts 112 through the ISM 116 to the contact pad 136.

This configuration may allow additional capabilities in the integrated circuit package system 500 by allowing the flip chip integrated circuit 502 to provide different technology, such as analog support or high speed processors. The outer package body 134, such as an epoxy molding compound, may be formed on the component side 106 of the substrate 102, the flip chip integrated circuit 502, the integrated circuit die 110, the electrical interconnects 114, and the ISM 116.

Figure 6:
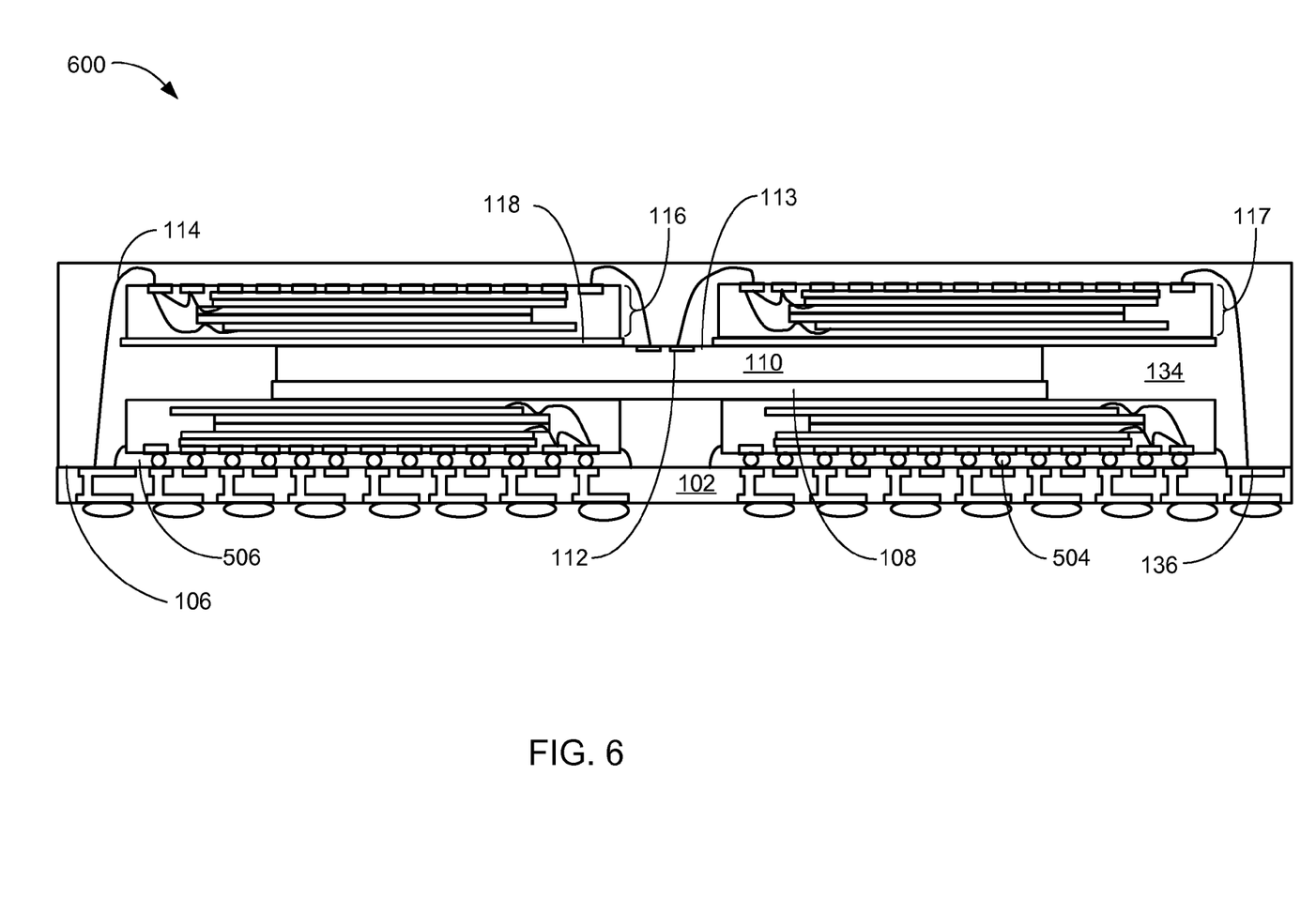
FIG. 6 is a cross-sectional view of an integrated circuit package system in a third alternative embodiment of the present invention.

Referring now to FIG. 6, therein is shown a cross-sectional view of an integrated circuit package system 600 in a third alternative embodiment of the present invention. The cross-sectional view of the integrated circuit package system 600 depicts the substrate 102 having the ISM 116, mounted in a bottom down orientation, coupled to the contact pad 136 by the chip interconnect 504. The under fill 506 may optionally be applied between the component side 106 and the ISM 116. In this example two of the ISM 116, in a bottom down orientation, may be coupled to the component side 106, but this is by way of an example. In the actual implementation the number and position of the ISM 116 coupled to the component side 106 may differ.

The first adhesive 108 may be applied on the ISM 116 that is coupled to the component side 106. The integrated circuit die 110 may be attached on the first adhesive 108. Another unit of the ISM 116, in a bottom up orientation, may be coupled to the active side of the integrated circuit die 110 by the second adhesive 118. The ISM 116 may be positioned adjacent to the center contacts 112 of the integrated circuit die 110. The electrical interconnect 114 may form the electrical connection from the center contact 112 through the ISM 116 to the contact pad 136. The outer package body 134, such as an epoxy molding compound, may be formed on the component side 106 of the substrate 102, the ISM 116 having the bottom down orientation, the integrated circuit die 110, the electrical interconnects 114, and the ISM 116 having the bottom up orientation.

Figure 7:
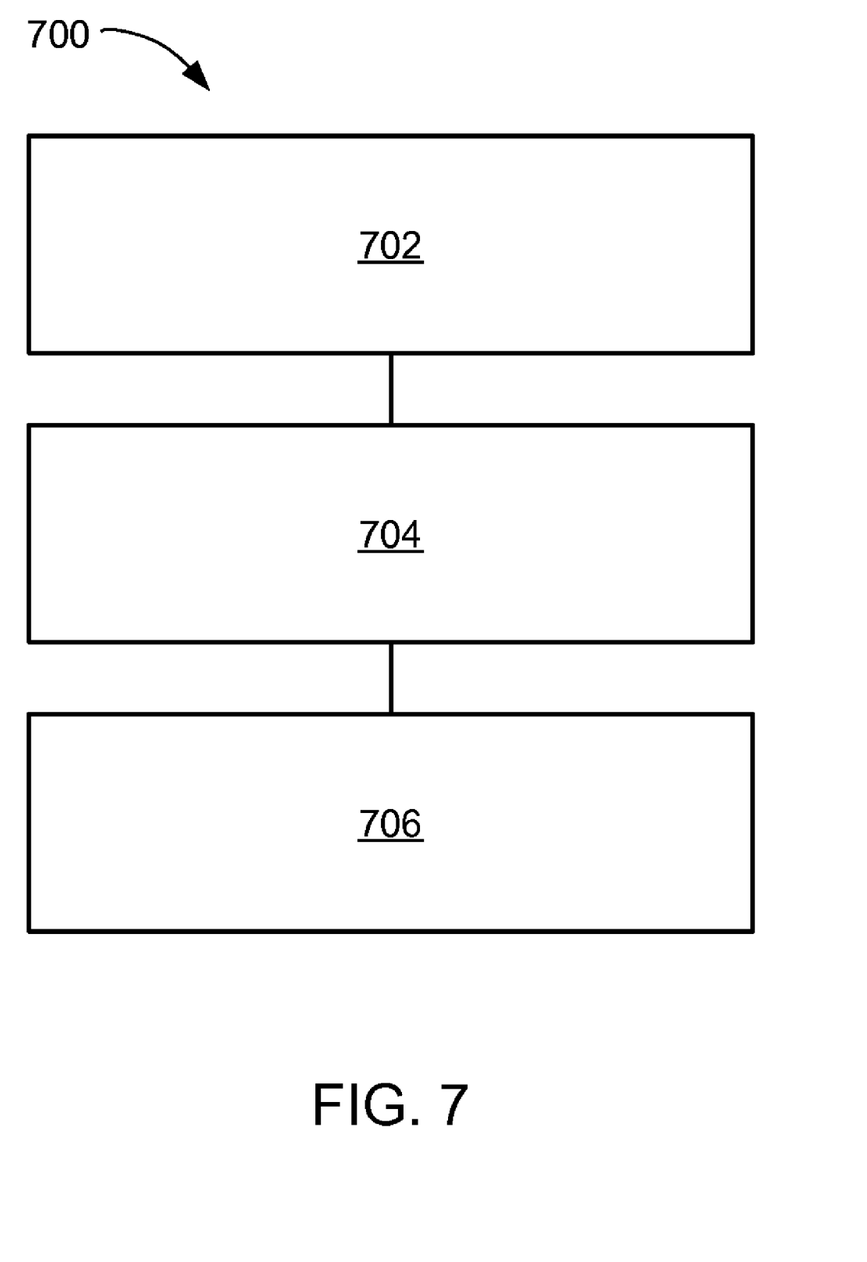
FIG. 7 is a flow chart of an integrated circuit package system for providing the integrated circuit package system with stacked devices in an embodiment of the present invention.

Referring now to FIG. 7, therein is shown a flow chart of an integrated circuit package system 700 for the integrated circuit package system 100 with stacked devices, in an embodiment of the present invention. The system 700 includes providing an integrated circuit die having an active side in a block 702; forming a first internal stacked module and a second internal stacked module over the active side of the integrated circuit die in a block 704; and coupling an electrical interconnect between the first internal stacked module or the second internal stacked module and the active side in a block 706.

It has been discovered that the present invention thus has numerous aspects.

A principle aspect that has been unexpectedly discovered is that the present invention may provide a way to double the amount of memory fabricated in the integrated circuit package system without increasing the foot print. This may represent a solution to the increasing demand for additional memory in a consumer electronic product while decreasing the size of the consumer electronic product.

Another aspect is integrated circuit package system with stacked devices may simplify the circuit board routing and reduce its size by maintaining the connections within the integrated circuit package system.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for increasing integrated circuit density without increasing the package foot print. The resulting processes and configurations are straightforward, cost-effective, uncomplicated, highly versatile and effective, can be surprisingly and unobviously implemented by adapting known technologies, and are thus readily suited for efficiently and economically manufacturing memory systems, micro processors, analog support chips, or similar devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
   providing an integrated circuit die having an active side;
   forming a first internal stacked module and a second internal stacked module directly attached to the active side of the integrated circuit die, the first internal stacked module coplanar with the second internal stacked module; and coupling an electrical interconnect between the first internal stacked module or the second internal stacked module and the active side.

2. The system as claimed in claim 1 wherein forming the first internal stacked module comprises:
   forming a module platform;
   mounting a first stacked integrated circuit over the module platform;
   forming a wire-in-film adhesive on the first stacked integrated circuit; and
   mounting a second stacked integrated circuit on the wire-in-film adhesive.

3. The system as claimed in claim 1 further comprising mounting a flip chip integrated circuit under the integrated circuit die.

4. The system as claimed in claim 1 further comprising attaching a passive side of the integrated circuit die directly to a flip chip integrated circuit.

5. The system as claimed in claim 1 further comprising forming an application device including fabricating a circuit board for mounting the integrated circuit package system.

6. An integrated circuit package system comprising:
   fabricating a substrate having a system side and a component side;
   mounting an integrated circuit die having an active side over the substrate including attaching a first adhesive under the integrated circuit die;
   forming a first internal stacked module and a second internal stacked module directly attached to the active side of the integrated circuit die including applying a second adhesive on the integrated circuit die, the first internal stacked module coplanar with the second internal stacked module;
   coupling an electrical interconnect between the substrate, the integrated circuit die, the internal stacked module, or a combination thereof; and
   forming an outer package body on the substrate, the integrated circuit die, the internal stacked module, and the electrical interconnect.

7. The system as claimed in claim 6 wherein forming the first internal stacked module comprises:
   forming a module platform including providing a lead on chip for coupling the integrated circuit die to the substrate;
   mounting a first stacked integrated circuit over the module platform wherein coupling the electrical interconnect includes coupling the first stacked integrated circuit to the module platform;
   forming a wire-in-film adhesive on the first stacked integrated circuit and the electrical interconnect;
   mounting a second stacked integrated circuit on the wire-in-film adhesive including stacking a third stacked integrated circuit over the second integrated circuit; and
   forming a module body on the module platform, the first stacked integrated circuit, the wire-in-film adhesive, the second stacked integrated circuit, the electrical interconnect, and the third stacked integrated circuit.

8. The system as claimed in claim 6 further comprising mounting a flip chip integrated circuit between the substrate and the integrated circuit die including flowing a chip interconnect between the flip chip integrated circuit and a contact pad on the component side of the substrate.

9. The system as claimed in claim 6 wherein forming the internal stacked module includes forming the internal stacked module between the substrate and the integrated circuit die including flowing a chip interconnect between the internal stacked module and a contact pad on the component side of the substrate.

10. The system as claimed in claim 6 further comprising forming an application device including fabricating a circuit board for mounting the integrated circuit package system includes providing a connector having a guide key.

11. An integrated circuit package system comprising:
    an integrated circuit die with an active side;
    a first internal stacked module and a second internal stacked module directly attached to the active side of the integrated circuit die, the first internal stacked module coplanar with the second internal stacked module; and
    an electrical interconnect between the first internal stacked module or the second internal stacked module and the active side.

12. The system as claimed in claim 11 wherein the first internal stacked module comprises:
    a module platform;
    a first stacked integrated circuit mounted over the module platform;
    a wire-in-film adhesive on the first stacked integrated circuit; and
    a second stacked integrated circuit on the wire-in-film adhesive.

13. The system as claimed in claim 11 further comprising a flip chip integrated circuit under the integrated circuit die.

14. The system as claimed in claim 11 further comprising a passive side of the integrated circuit die directly attached to a flip chip integrated circuit.

15. The system as claimed in claim 11 further comprising an application device includes:
    a system interconnect on the substrate; and
    a circuit board coupled to the system interconnect.

16. The system as claimed in claim 11 further comprising:
    a substrate with a system side and a component side;
    a first adhesive under the integrated circuit die; and
    a second adhesive between the first internal stacked module and the integrated circuit die.

17. The system as claimed in claim 16 wherein the first internal stacked module comprises:
    a module platform includes a lead on chip for coupling the integrated circuit die to the substrate;
    a first stacked integrated circuit over the module platform wherein the electrical interconnect includes the first stacked integrated circuit coupled to the module platform;
    a wire-in-film adhesive on the first stacked integrated circuit and the electrical interconnect;
    a second stacked integrated circuit on the wire-in-film adhesive includes a third stacked integrated circuit over the second integrated circuit; and
    a module body on the module platform, the first stacked integrated circuit, the wire-in-film adhesive, the second stacked integrated circuit, the electrical interconnect, and the third stacked integrated circuit.

18. The system as claimed in claim 16 further comprising a flip chip integrated circuit between the substrate and the integrated circuit die includes a chip interconnect between the flip chip integrated circuit and a contact pad on the component side of the substrate.

19. The system as claimed in claim 16 wherein the internal stacked module includes the internal stacked module between the substrate and the integrated circuit die includes a chip interconnect between the internal stacked module and a contact pad on the component side of the substrate.

20. The system as claimed in claim 16 further comprising an application device includes:
- a system interconnect on the system side of the substrate; and
- a circuit board coupled to the system interconnect wherein the circuit board includes a connector with a guide key.

* * * * *